(12) United States Patent
Kobayashi

(10) Patent No.: US 7,224,306 B2
(45) Date of Patent: May 29, 2007

(54) ANALOG-TO-DIGITAL CONVERTER IN WHICH SETTLING TIME OF AMPLIFIER CIRCUIT IS REDUCED

(75) Inventor: Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/299,741

(22) Filed: Dec. 13, 2005

(65) Prior Publication Data

US 2006/0125676 A1    Jun. 15, 2006

(30) Foreign Application Priority Data

Dec. 13, 2004   (JP) ............................. 2004-360538

(51) Int. Cl.
*H03M 1/12* (2006.01)
(52) U.S. Cl. .................. 341/155; 341/120; 341/156; 341/161; 341/162; 341/172
(58) Field of Classification Search ................ 341/118, 341/120, 161
See application file for complete search history.

(56) References Cited

U.S. PATENT DOCUMENTS 5,274,377 A * 12/1993 Matsuura et al. ........... 341/161
6,606,042 B2 * 8/2003 Sonkusale et al. .......... 341/120
6,859,158 B2 * 2/2005 Wada et al. ................. 341/155
6,891,486 B1 * 5/2005 Pentakota et al. .......... 341/120

FOREIGN PATENT DOCUMENTS

JP          04-026229          1/1992

* cited by examiner

*Primary Examiner*—Khai M. Nguyen
(74) *Attorney, Agent, or Firm*—McDermott Will & Emery LLP

(57) ABSTRACT

A first amplifier circuit samples an input analog signal and holds the sampled signal for a predetermined period of time. A first analog-to-digital converter circuit samples the input analog signal and converts the sampled signal into a digital value of a predetermined number of bits. A first digital-to-analog converter circuit converts an output signal from the first analog-to-digital converter circuit into an analog signal. A first subtracting amplifier circuit with a capacitively coupled input receives a signal at one end of a capacitor connected to an input terminal of the subtracting amplifier circuit and which samples a signal occurring at the other end of the capacitor, the subtracting amplifier circuit subtracting an output signal from the first digital-to-analog converter circuit from an output signal from the first amplifier circuit, The first digital-to-analog converter circuit outputs the analog signal to the capacitor before a first switch is turned on, in order to adjust charges stored in the capacitor.

12 Claims, 10 Drawing Sheets

ANALOG-TO-DIGITAL CONVERTER IN WHICH SETTLING TIME OF AMPLIFIER CIRCUIT IS REDUCED

BACKGROUND OF THE INVENTION

1. Field of the Invention

The present invention relates to an analog-to-digital converter and, more particularly, to an analog-to-digital converter for converting an analog signal into a digital value in multiple steps.

2. Description of the Related Art

In recent years, a variety of additional functions are built in mobile appliances such as a mobile telephone set, including image pick-up function, image playback function, moving image pick-up function and moving image playback function. In association with this, there is an increasing demand for miniaturization and power saving of an analog-digital converter (hereinafter, referred to as an AD converter). One mode of AD converter that addresses this demand is known as a cyclic AD converter that cycles through stages (see, for example, patent document No. 1). Patent document No. 1 discloses an AD converter of a pipeline type comprising two blocks that include a conversion block of a cyclic type.

[patent document No. 1]

JP 4-26229

In the AD converter shown in FIG. 1 of patent document No. 1, a first switch SW1 is provided between a sample and hold circuit S/H2 of a first AD/DA block and a sample and hold circuit S/H3 of a second AD/DA block, and between the sample and hold circuit S/H2 and a parallel A/D converter AD2.

We have identified a problem associated with an AD converter of this type. Namely, if the sample and hold circuit S/H 3, for example, is embodied by a circuit with a capacitively coupled input such as a switched capacitor operational amplifier, the output of the operational amplifier used in the sample and hold circuit S/H2 is adversely affected by charges stored in a capacitor connected to the input terminal of the operational amplifier, causing settling time to be extended.

SUMMARY OF THE INVENTION

The present invention has been made in the background as described above and primarily pertains to an analog-to-digital converter in which settling time of an amplifier circuit used as a circuit element therein is reduced and the speed of operation is improved.

In one embodiment of the present invention, an analog-to-digital converter which converts an analog signal into a digital value in a plurality of steps, comprises: an amplifier circuit which amplifies an input analog signal by a predetermined amplification factor; a circuit element with a capacitively coupled input which receives an output signal from the amplifier circuit at one end of a capacitor connected to an input terminal of the circuit element and which samples an output signal occurring at the other end of the capacitor. An adjustment voltage for adjusting charges stored in the capacitor is applied to the capacitor before the output signal is input to the capacitor. The circuit element may be an amplifier circuit for amplifying a sampled analog signal or an AD converter circuit for converting a sampled analog signal into a digital signal of a predetermined number of bits.

According to this embodiment, distortion that may occur in the signal output from the amplifier circuit to the circuit element is mitigated so that settling time is reduced. Thus, the speed of operation of the AD converter as a whole is improved.

The analog-to-digital converter may further comprise a switch which applies on and off control of a route between the amplifier circuit and the circuit element. The adjustment voltage may be applied to the capacitor before the switch is turned on. According to this embodiment, distortion that may occur in the signal output from the amplifier circuit when the switch is turned on is mitigated.

The analog-to-digital converter may further comprise a predictor unit which predicts a voltage of the output signal sampled by the circuit element. The predictor unit may apply the predicted voltage to the capacitor as the adjustment voltage. The predicted voltage may approximate the voltage of the output signal sampled by the circuit element or a predetermined voltage. According to this embodiment, a difference between the voltage of the signal output from the amplifier circuit to the circuit element and the voltage stored in the capacitance is reduced so that distortion that may occur in the signal is mitigated.

Another embodiment of the present invention also relates to an analog-to-digital converter. In another embodiment of the present invention, an analog-to-digital converter which converts an input analog signal into a digital value in a plurality of steps, comprises: an analog-digital converter circuit which samples an input analog signal and converts the sampled analog signal into a digital value of a predetermined number of bits; a digital-to-analog converter circuit which converts an output signal of the analog-to-digital converter circuit into an analog signal; a first amplifier circuit which is provided parallel to the analog-to-digital circuit and amplifies the analog signal sampled by the analog-to-digital converter circuit by a predetermined amplification factor; a subtracting amplifier circuit with a capacitively coupled input which receives a signal at one end of a capacitor connected to an input terminal of the subtracting amplifier circuit and which samples a signal occurring at the other end of the capacitor, the subtracting amplifier circuit subtracting an output signal from the digital-to-analog converter circuit from an output signal from the first amplifier circuit and amplifying a result of subtraction by a predetermined amplification factor. The output signal from the digital-to-analog converter circuit is applied to the capacitor before the output signal from the first amplifier circuit is input to the capacitor. The amplification factor of the first amplifier circuit may practically be 1.0 and the first amplifier circuit may function as a sample and hold circuit. The subtracting amplifier circuit may be a switched capacitor operational amplifier. The output signal from the digital-to-analog converter circuit may be applied to the capacitor before the output signal of the first amplifier circuit is input to the capacitor, in order to adjust charges stored in the capacitor.

Accordingly to this embodiment, distortion that may occur in the signal output from the first amplifier circuit to the subtracting amplifier circuit is mitigated so that settling time is reduced. Thus, the speed of operation of the AD converter as a whole is improved.

The analog-to-digital converter circuit may further comprise a switch which applies on and off control of a route between the first amplifier circuit and the subtracting amplifier circuit. The output signal from the digital-to-analog converter circuit may be input to the capacitor before the switch is turned on. The subtracting amplifier circuit may be shared between a plurality of stages for subtracting amplification. The switch maybe turned on before subjecting the output signal from the first amplifier circuit and the output signal from the digital-to-analog converter circuit to subtracting amplification. According to this embodiment, distortion that may occur in the signal output from the amplifier circuit when the switch is turned on is mitigated.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on the preferred embodiments. This does not intend to limit the scope of the present invention, but exemplify the invention.

First Embodiment

The structure of an AD converter 1 according to the first embodiment is such that a preceding stage of a non-cyclic type converts into 4 bits and a subsequent stage of a cyclic type converts into 2 bits in each cycle. By allowing the subsequent stage to go through 3 cycles, a total of 10 bits are output. The preceding stage and the subsequent stage share a first DA converter circuit 16, a first subtractor circuit 18 and a second amplifier circuit 20.

Figure 1:
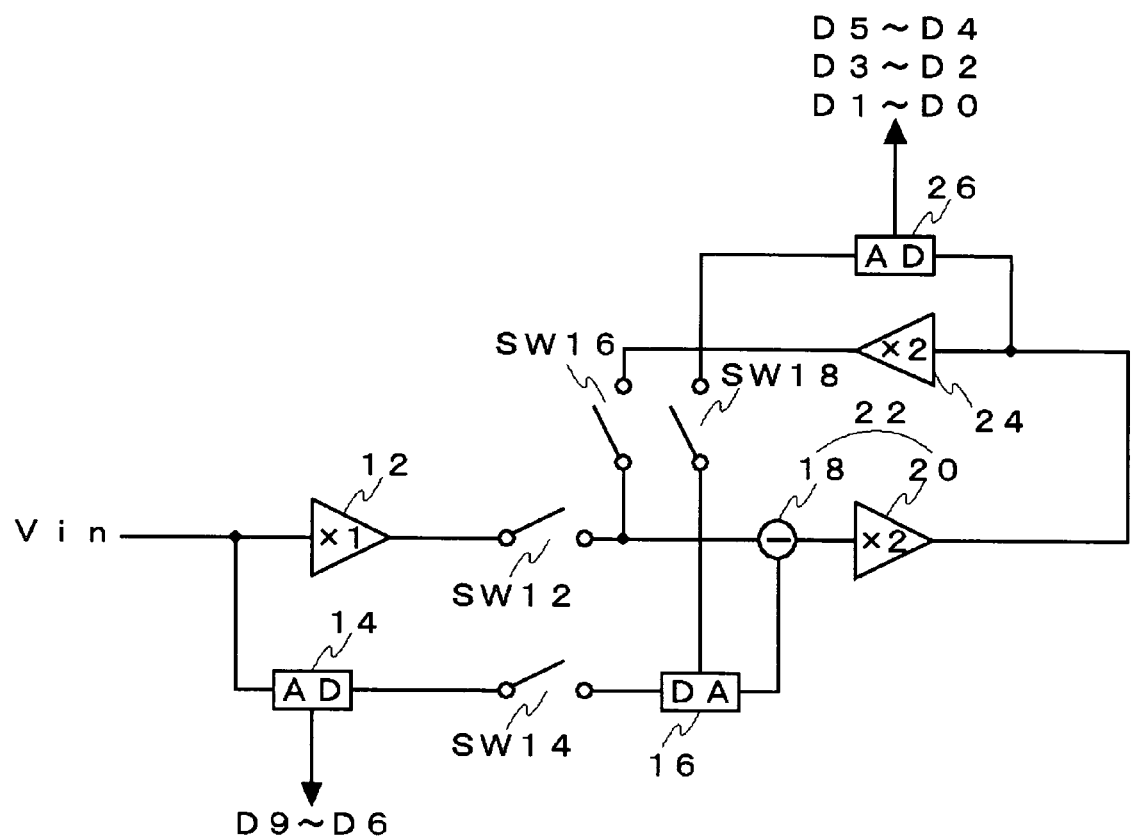
FIG. 1 shows the structure of an AD converter according to a first embodiment of the present invention.

FIG. 1 shows the structure of the AD converter 1 according to the first embodiment. A description will first be given of a preceding stage in the AD converter 1. In an initial state, a first switch SW12 and a second switch 14 are turned on, and a third switch SW16 and a fourth switch SW18 are turned off. An input analog signal Vin is fed to a first amplifier circuit 12 and a first AD converter circuit 14. The first amplifier circuit 12 and the first AD converter circuit 14 sample the input analog signal Vin according to the same timing schedule. The first AD converter circuit 14 is of a flash type and the resolution thereof, i.e. the number of bits produced by conversion thereby, is 4 bits. The first AD converter circuit 14 converts the sampled input analog signal Vin into a digital value, retrieves the higher 4 bits (D9-D6) and outputs the bits to an encoder (not shown) and to the first DA converter circuit 16 via the second switch SW14. The first DA converter circuit 16 converts the digital value produced by conversion by the first AD converter circuit 14 into an analog value. As described later, the first AD converter circuit 14 and the first DA converter circuit 16 each functions as a predictor unit for predicting the input analog signal Vin sampled by the first amplifier circuit 12.

The first amplifier circuit 12 holds the input analog signal Vin thus sampled for a predetermined period of time and outputs the signal to a first subtractor circuit 18 via the first switch SW12 according to a predetermine timing schedule. The first amplifier circuit 12 provides an amplification gain of 1.0 so as to function as a sample and hold circuit. The first subtractor circuit 18 subtracts the output of the first DA converter circuit 16 from the output of the first amplifier circuit 12. The second amplifier circuit 20 amplifies the output of the first subtractor circuit 18 by a factor of 2. A first subtracting amplifier circuit 22 of an integral type may be used instead of the first subtractor circuit 18 and the second amplifier circuit 20. In this way, the circuit is simplified.

A description will now be given of the subsequent stage. The output analog signal of the second amplifier circuit 20 is fed to a third amplifier circuit 24 and a second AD converter circuit 26. The third amplifier circuit 24 and the second AD converter circuit 26 sample the analog signal according to the same timing schedule. The second AD converter circuit 26 is also of a flash type and the resolution thereof, i.e. the number of bits produced including the redundant 1 bit, is 3 bits. A reference voltage supplied to a comparator (not shown) constituting the second AD converter circuit 26 is configured to be ½ a reference supplied to a comparator (not shown) constituting the first AD converter circuit 14. Since the second AD converter circuit 26 converts into 2 bits, the analog output from the first AD converter circuit 14 should practically be amplified by a gain of 4 (2 raised to the 2nd power). Since the gain of second amplifier circuit 20 is 2.0, the reference voltage is reduced to ½ to achieve the desired result.

At this point of time, the first switch SW12 and the second switch SW14 are turned off and the third switch SW16 and the fourth switch SW18 have made a transition to an on state. The second AD converter circuit 26 converts the sampled analog signal into a digital value, retrieves the 5th through 6th highest bits (D5-D4), and outputs the bits to an encoder (not shown) and to the first DA converter circuit 16 via the fourth switch SW18. The first DA converter circuit 13 converts the digital value produced by conversion by the second AD converter circuit 26 into an analog value.

The third amplifier circuit 24 amplifies the sampled analog signal by a factor of 2.0 and outputs the amplified signal to the first subtractor circuit 18 via the third switch SW16. The first subtractor circuit 18 subtracts the output of the first DA converter circuit 16 from the output of the third amplifier circuit 24 and outputs a difference to the second amplifier circuit 20. The output of the first DA converter circuit 16 is amplified practically by a gain of 2. This is achieved by configuring a ratio between the reference voltage range of the second AD converter circuit 26 and the reference voltage range of the first DA converter circuit 16 to be 1:2. For example, the ratio of 1:2 is achieved by configuring the second AD converter circuit 26 as a single input circuit and the first DA converter 16 as a differential output circuit. Thus, some provision is required to control whether to amplify the output of the first DA converter circuit 16, depending on the cycle.

The second amplifier circuit 20 amplifies the output of the first subtractor circuit 18 by a factor of 2. The analog signal amplified by the second amplifier circuit 20 is fed back to the third amplifier circuit 24 and the second AD converter circuit 26. The process described above is repeated so that the second AD converter circuit 38 retrieves the 7th through 8th highest bits (D3-D2) and the 9th through 10th highest bits (D1-D0). With this, a 10-bit digital value is obtained. The 5th through 10th highest bits are obtained by the subsequent stage of a cyclic type.

Figure 2:
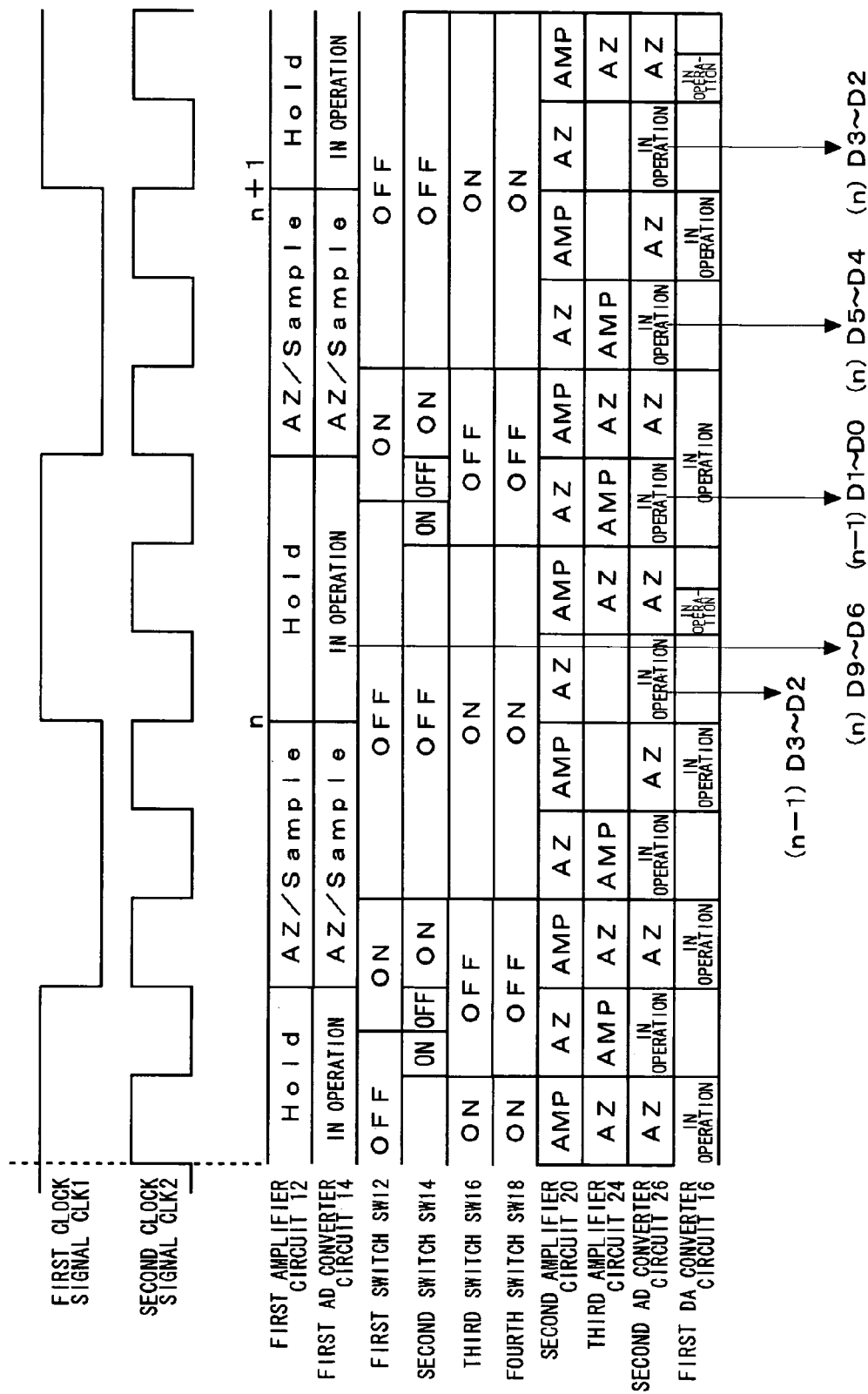
FIG. 2 is a timing chart showing the operating process of the AD converter according to the first embodiment.

FIG. 2 is a timing chart showing the operating process of the AD converter 1 according to the first embodiment. The process will be described from the first step downward in the figure. Two waveforms at the top are for a first clock signal CLK1 and a second clock signal CLK2. The first clock signal CLK1 controls the operation of the first amplifier circuit 12 and the first AD converter circuit 14. The second clock signal CLK2 controls the operation of the first DA converter circuit 16, the second amplifier circuit 20, the third amplifier circuit 24 and the second AD converter circuit 26.

The frequency of the second clock signal CLK2 is three times that of the first clock signal CLK1. The second clock signal CLK2 may be generated by multiplying the first clock signal CLK1 using a PLL or the like. A rising edge of the second clock signal CLK2 is synchronized with a falling edge of the first clock signal CLK1. Subsequently, a second falling edge of the second clock signal CLK2 is synchronized with a rising edge of the first clock signal CLK1. Further, a fourth rising edge of the second clock signal CLK2 is synchronized with a second falling edge of the first clock signal CLK1.

The first amplifier circuit 12 and the first AD converter circuit 14 sample the input analog signal Vin at a rising edge of the first clock signal CLK1. The first amplifier circuit 12 holds the sampled analog signal when the first clock signal CLK1 is high and is an auto-zero operation mode when the first clock signal CLK1 is low. The second amplifier circuit 20 samples the input analog signal at a falling edge of the second clock signal CLK2. When the second clock signal CLK2 is high, the second amplifier circuit 20 amplifies the sampled analog signal and outputs the amplified signal to the third amplifier circuit 24 and the second AD converter circuit 26. When the second clock signal CLK2 is high, the second amplifier circuit 20 is placed in an auto-zero operation mode. When the first subtracting amplifier circuit 22 is used instead of the second amplifier circuit 20, the first subtracting amplifier circuit 22 subjects the sampled signal to subtraction and amplification when the second clock signal CLK2 is high.

The first AD converter circuit 14 converts the sampled input analog signal into a digital value comprising the bits D9-D6 when the first clock signal CLK1 is high and is placed in an auto-zero operation mode when the first clock signal CLK1 is low. The first DA converter circuit 16 holds the converted data when the second clock signal CLK2 is high and is in an undefined state when the second clock signal CLK2 is low. When converting from the bits D3-D2 output from the second AD converter circuit 26, the first DA converter circuit 16 holds the converted data until the middle of the high period of the second clock signal CLK2 and is in an undefined state in the remainder of the high period. In a subsequent period of the second clock signal CLK2, the first DA converter circuit 16 holds the converted data converted from the bits D9-D6 output from the first AD converter circuit 14.

The first switch SW12, the second switch SW14, the third switch SW16 and the fourth switch SW18 are subject to on and off control by predetermined switch signals. The third switch SW16 and the fourth switch SW18 are turned on and off according to the same timing schedule. The second switch SW14 is turned on in a period when the period for amplification by the second amplifier circuit 20 is completed and the first switch SW12 is yet to be turned on, in order to adjust charges stored in the capacitor of the second amplifier circuit 20. Subsequently, the first switch SW12 is turned on. The second switch SW14 is then turned on again in order to output an analog signal for the subtracting operation. When the period for amplification by the second amplifier circuit 20 is completed, the first switch SW12 and the second switch SW14 are turned off. When the second switch SW14 is turned on again after the first switch SW12 is turned on, the value of the output voltage of the first DA converter circuit 16 is close to that of the voltage at the input terminal of the second amplifier circuit 20. Therefore, the output voltage is distorted only slightly, if any.

The third amplifier circuit 24 and the second AD converter circuit 26 sample the input analog signal Vin at a falling edge of the second clock signal CLK2. The third amplifier circuit 24 amplifies the sampled analog signal when the second clock signal CLK2 is low and is placed in an auto-zero operation mode when the second clock signal CLK2 is low. Amplification is not performed when the second AD converter circuit 26 outputs the lowermost bits D1-D0. When the second clock signal CLK2 is low, the second AD converter circuit 26 converts into 2 bits not including a redundant bit. The second AD converter 26 is placed in an auto-zero operation mode when the second clock signal CLK2 is high.

In an auto-zero period of the first amplifier circuit 12, the second amplifier circuit 20, the third amplifier circuit 24, the first AD converter circuit 14 and the second AD converter circuit 26, the input signal is being sampled. As shown, concurrently with the conversion by the second AD converter circuit 26 into D3-D2 and D1-D0, the first AD converter circuit 14 converts from a subsequently input analog signal Vin. According to the pipeline process as described above, the AD converter 1 as a whole is capable of outputting a digital value of 10 bits once in a cycle defined by the first clock signal CLK1.

Figure 3A:
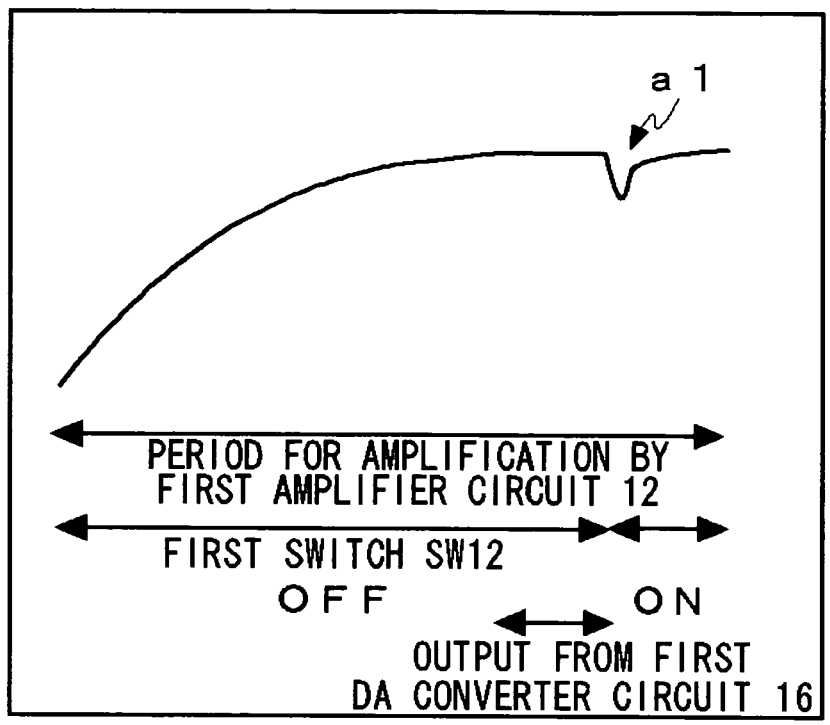
FIG. 3A shows the operation of a first amplifier circuit and a first switch of the AD converter according to the first embodiment.

FIG. 3A shows the operation of the first amplifier circuit 12 and the first switch SW12 of the AD converter 1 according to the first embodiment. The analog waveform in FIG. 3A is the waveform of the output signal of the first amplifier circuit 12. In a period for amplification by the first amplifier circuit 12, i.e. during the hold period shown in FIG. 2, the first AD converter circuit 14 retrieves the higher 4 bits from the sampled analog signal. The first DA converter circuit 16 converts the bits into an analog signal. The second switch SW14 is turned on before the first switch SW12 is turned on. The first DA converter circuit 16 outputs the analog signal derived from conversion to the first subtracting amplifier circuit 22.

Figure 3B:
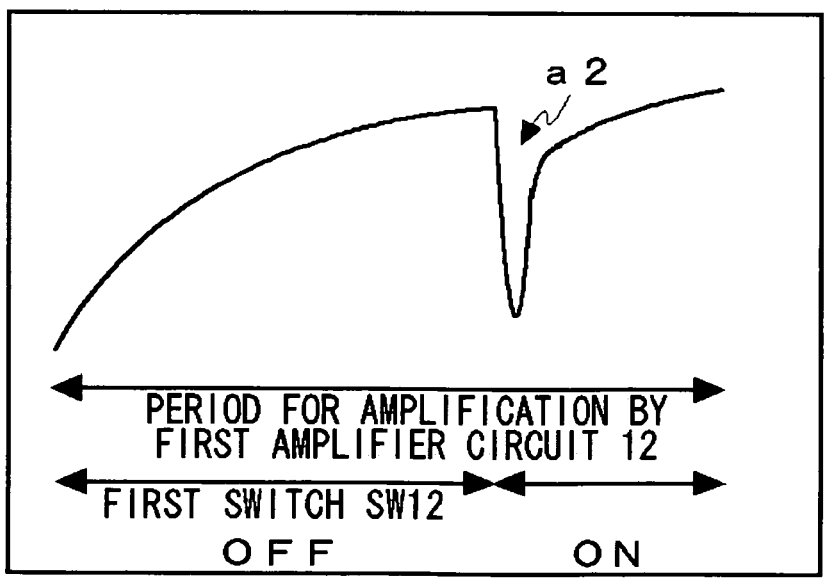
FIG. 3B shows the operation of a first amplifier circuit and a first switch in an AD converter according to a comparative example.

If the first subtracting amplifier circuit 22 is formed of a switched capacitor operational amplifier described later, the first subtracting amplifier circuit 22 chops the input analog signal so as to sample the analog signal occurring at a given point of time. This causes charges to be stored in a capacitor connected to the input terminal of the first subtracting amplifier circuit 22. When the first switch SW12 is turned on in this state, the charges may be drained into the first amplifier circuit 12, as shown in the waveform of FIG. 3B. The charges represent noise components that may distort the output waveform of the first amplifier circuit 12. By outputting a voltage close to the output voltage of the first amplifier circuit 12 to the capacitor, the noise components are suppressed.

The output value of the first DA converter circuit 16 represents higher bit components of the analog signal sampled by the first amplifier circuit 12 and so is close to the output of the first amplifier circuit 12. In other words, the value of the output of the first DA converter circuit 16 represents a value predicting, with a predetermined precision, an input from the first amplifier circuit 12 to the first subtracting amplifier circuit 22. The predetermined precision differs depending on the resolution of the first AD converter circuit 14. The higher the resolution, the higher the precision. Since the resolution of the first AD converter 14 in this case is 4 bits, the first DA converter circuit 16 is capable of predicting with a precision of $1/16$ of the peak-to-peak value of a predicted signal, other things being equal. As shown in FIG. 3A, by ensuring that the first switch SW12 is turned on after adjusting charges in the capacitor, distortion in the output waveform of the first amplifier circuit 12 is mitigated since the noise components are reduced.

FIG. 3B shows the operation of the first amplifier circuit 12 and the first switch SW12 of the first AD converter 1 in a comparative example. In this AD converter 1, the first switch SW12 is turned on according to the timing schedule shown in FIG. 2 of the second switch SW14. Accordingly, the first switch SW12 is turned while charges of unknown magnitude (such as residual charges that remain from the previous subtracting amplification period) are stored in the capacitor of the first subtracting amplifier circuit 22. This will generate large distortion a2 in the output waveform of the first amplifier circuit 12 as shown in FIG. 3B because the charges stored in the capacitor represent noise components.

Figure 4:
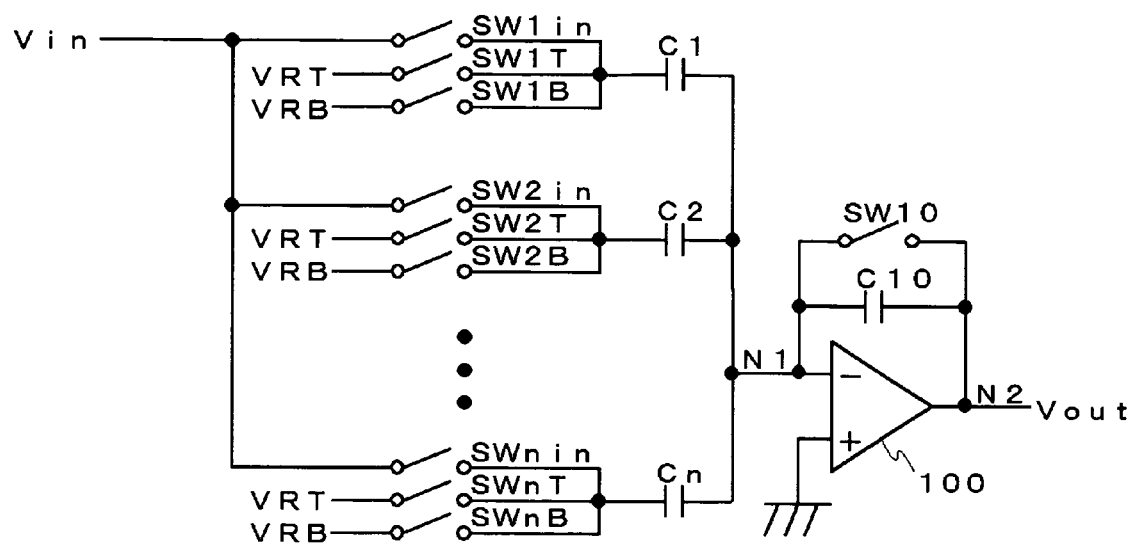
FIG. 4 shows an exemplary structure 1 of a first DA converter circuit and a first subtracting amplifier circuit of the AD converter according to the first embodiment.

FIG. 4 shows an exemplary structure 1 of the first DA converter circuit 16 and the first subtracting amplifier circuit 22 of the AD converter 1 according to the first embodiment. In the structure 1, the first subtracting amplifier circuit 22 is embodied by a single-ended switched capacitor amplifier. Input capacitors C1–Cn are connected to the inverting input terminal of an operational amplifier 100. The input capacitors C1–Cn are connected to Vin switches SW1in–SWnin for subjecting the input signal Vin to on and off control, respectively. The input capacitors C1–Cn are also connected to VRT switches SW1T–SWnT for subjecting a higher reference voltage VRT to on and off control, respectively. The input capacitors C1–Cn are also connected to VRB switches SW1B–SWnB for subjecting a lower reference voltage VRB to on and off control.

The input capacitors C1–Cn, the VRT switches SW1T–SWnT and the VRB switches SW1B–SWnB constitute the first DA converter circuit 16. The Vin switches SW1in–SWnin correspond to the first switch SW12 shown in FIG. 1 and FIG. 2. The VRT switches SW1T–SWnT and the VRB switches SW1B–SWnB correspond to the second switch SW14. The second switch SW14 may be provided on individual paths between the Vin switches SW1in–SWnin/VRB switches SW1B–SWnB and the input capacitors C1–Cn.

The non-inverting input terminal of the operational amplifier 100 is connected to an auto-zero potential. The output terminal and the inverting input terminal of the operational amplifier 100 are connected to each other via a feedback capacitor C10. An auto-zero switch SW10 is connected across the feedback capacitor C10 to enable short circuit between the output terminal and the inverting input terminal of the operational amplifier 100.

A description will now be given of the operation of the single-ended switched capacitor amplifier shown in FIG. 4. Charge QA at input node N1, occurring when the Vin switches SW1in–SWnin are turned on, the VRT switches SW1T–SWnT are turned off and the VRB switches SW1B–SWnB are turned off and the auto-zero switch SW10 is turned on, is given by the following equation (A1)

$$QA = C1 \sim Cn(Vin1 - Vag) \quad (A1)$$

where C1~Cn denote the total capacitance of the capacitors C1–Cn and Vag denotes an auto-zero potential of the operational amplifier 100.

Charge QB at input node N1 virtually grounded, occurring when the Vin switches SW1in–SWnin are turned off, the auto-zero switch SW10 is turned off, the VRT switches SW1T–SWnT and the VRB switches SW1B–SWnB operate normally, is given by the following equation (A2). The VRT switches SW1T–SWnT and the VRB switches SW1B–SWnB are turned on or off depending on the output of the first AD converter circuit 14 and determine the number of inputs of higher reference voltages VRT and lower reference voltages VRB applied to the input capacitors C1–Cn.

$$QB = C1 \sim Cn(Vref - Vag) + C10(Vout - Vag) \quad (A2)$$

where Vref denotes a reference voltage generated from at least one of the higher reference voltage VRT and the lower reference voltage VRB, and C10 denotes the capacitance of the feedback capacitor C10.

Since there are no routes for charges to be dissipated through input node N1, the principle of conservation of charge demands QA=QB, so that the following equation (A3) holds.

$$Vout = C1 \sim Cn/C10(Vina - Vref) + Vag \quad (A3)$$

Accordingly, given that the auto-zero potential Vag is an ideal ground potential, the single-ended switched capacitor amplifier is capable of amplifying a difference obtained by subtracting the reference voltage Vref from the input signal Vin, according to a capacitance ratio occurring between the input capacitors C1–Cn and the feedback capacitor C10. Even if the auto-zero potential Vag is not an ideal ground potential, an approximation can be obtained.

In the structure 1 described above, the first AD converter circuit 14 converts the analog signal sampled by the first amplifier circuit 12 into a digital value of 4 bits. The digital value may be used to predict, with a precision of 4 bits, the voltage occurring when the first amplifier circuit 12 settles. A voltage that approximates the output voltage occurring when the first amplifier circuit 12 settles is fed to the input capacitors C1–Cn by controlling the number of switches (the VRT switches SW1T–SWnT and the VRB switches SW1n–SWnB) turned on and turned off. This ensures that the output voltage of the first amplifier circuit 12 is substantially equal to the voltage stored in the input capacitors C1–Cn of the first subtracting amplifier circuit 22, when the first amplifier circuit 12 and the first subtracting amplifier circuit 22 are connected to each other. Thus, adverse effects of noise on the output of the first amplifier circuit 12 are mitigated so that the output is allowed to settle earlier than otherwise.

Figure 5:
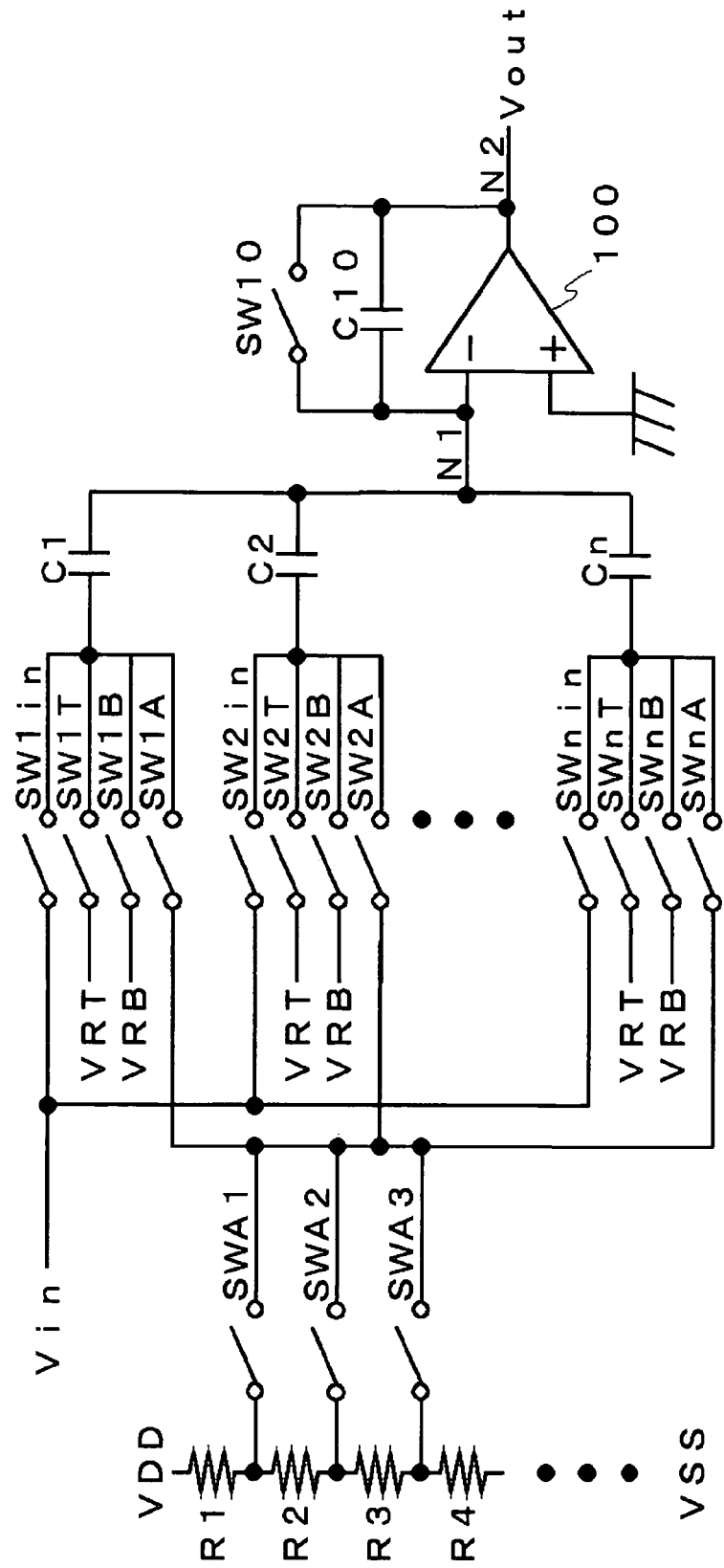
FIG. 5 shows an exemplary structure 2 of a first DA converter circuit and a first subtracting amplifier circuit of the AD converter according to the first embodiment.

FIG. 5 shows an exemplary structure 2 of the first DA converter circuit 16 and the first subtracting amplifier circuit 22 of the AD converter 1 according to the first embodiment. In the structure 2, the first subtracting amplifier 22 is embodied by a single-ended switched capacitor amplifier. Features not found in the structure 1 are added in the structure 2. The following description concerns the added features.

Referring to FIG. 5, a resistor string composed of resistors R1-Rn is provided between predetermined potentials (for example, between a power supply voltage VDD and a ground potential VSS). The structure is configured such that voltages can be supplied from nodes between adjacent resistors R1-Rn constituting the resistor string to the input capacitors C1–Cn via refresh voltage generating switches SWA1-SWAn and refresh voltage supplying switches SW1A-SWnA. The term "refresh voltage" refers to a voltage supplied to counter adverse effects of charges stored in the input capacitors C1–Cn. For example, a node between the first resistor R1 and the second resistor R2 is connected to the first refresh voltage generating switch SWAL so that a voltage produced by voltage division by the resistors R1 and R2 is supplied to the input capacitors C1–Cn.

A predetermined refresh potential is generated by turning on one of the refresh voltage generating switches SWA1-SWAn in accordance with the bits D9-D6 output from the first AD converter circuit 14. The refresh voltage supplying switches SW1A-SWnA are also subject to on and off control in accordance with the output bits D9-D6 so as to supply a predetermined voltage to each of the input capacitors C1–Cn. The voltage is determined by the refresh potential generated by selecting the refresh voltage generating switches SWA1-SWAn as well as by the number of switches constituting the refresh voltage supplying switches SW1A-SWnA being turned on.

By relating the output digital value of the first AD converter circuit 14 to the switching configuration of these switches, a desired voltage can be supplied to each of the input capacitors C1–Cn. More specifically, the output voltage of the first amplifier circuit 12 is predicted by referring to the 4-bit digital value output from the first AD converter circuit 14, and the refresh voltage generating switches SWA1-SWAn and the refresh voltage supplying switches SW1A-SWnA are configured accordingly. In this process, a voltage substantially equal to the voltage corresponding to the 4 bits may be set up. Alternatively, a voltage corresponding to the 4 bits and a median value of the lower 6 bits taken together may be set up. Still alternatively, a voltage corresponding to the 4 bits and an average of the lower 6 bits output from the previous conversion taken together may be set up.

The structure 2 provides the same advantage as that of the structure 1. An additional advantage is that the output voltage of the first amplifier circuit 12 can be predicted with higher precision. Thus, adverse effects of noise from the second amplifier circuit 20 or the first subtracting amplifier circuit 22 on the output voltage of the first amplifier circuit 12 are further mitigated so that settling time is reduced.

As described above, according to the first embodiment, distortion of the output voltage of the first amplifier circuit 12 that may occur when the first amplifier circuit 12 and the first subtracting amplifier circuit 22 are connected is mitigated so that settling time of the output of the first amplifier circuit 12 is shortened. Accordingly, the speed of operation of the AD converter 1 as a whole is improved. Advantageously, existing components including the first AD converter circuit 14 and the first DA converter circuit 16 can be taken advantage of so that the above-mentioned goal is achieved without increasing the circuit scale.

Second Embodiment

The second embodiment pertains to an AD converter 2 in which a preceding stage of a non-cyclic type converts into 4 bits and a subsequent stage of a cyclic type converts into 3 bits in each cycle. By allowing the subsequent stage to go through 3 cycles, a total of 13 bits are output.

Figure 6:
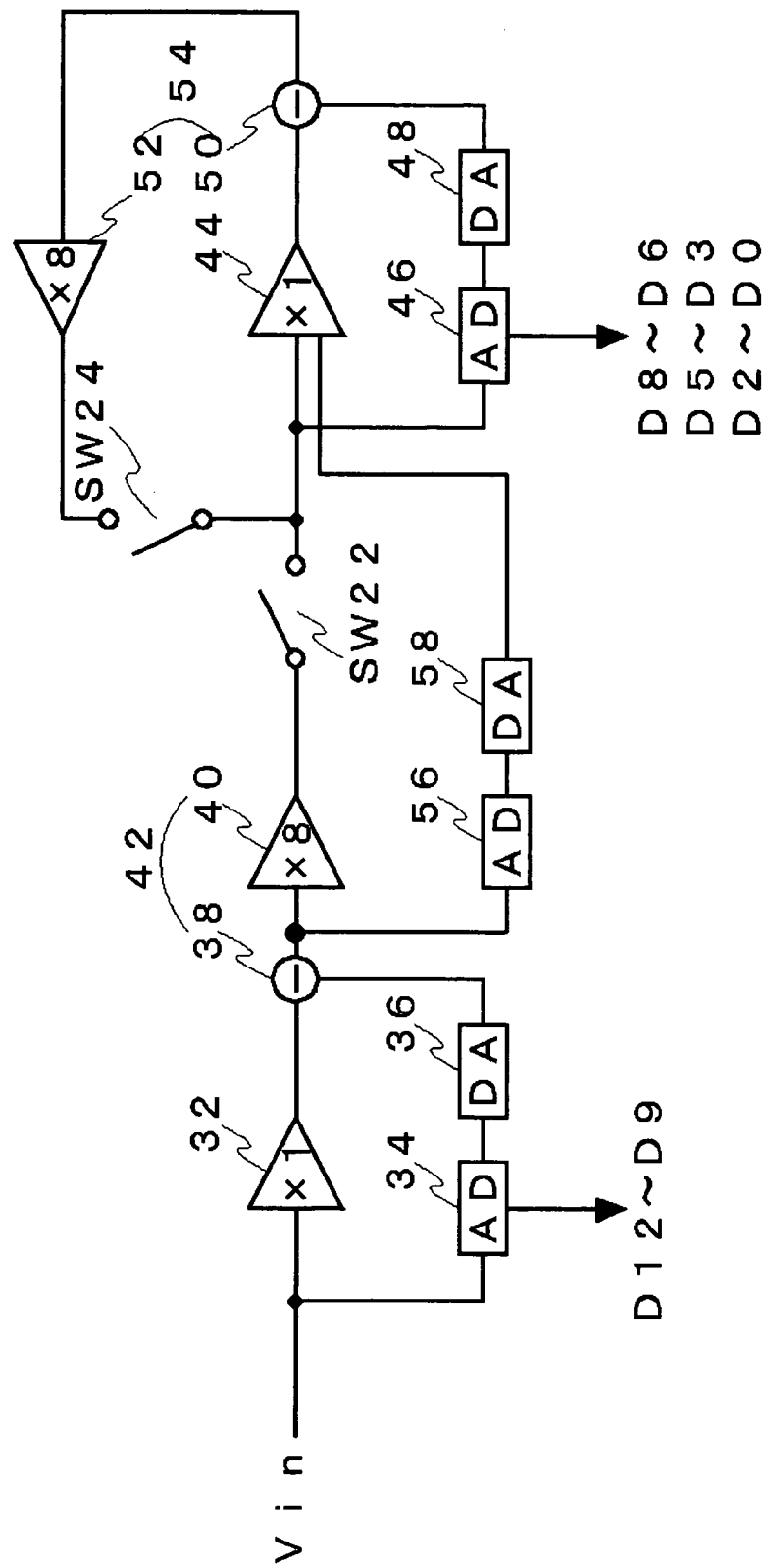
FIG. 6 shows the structure of an AD converter according to a second embodiment of the present invention.

FIG. 6 shows the structure of the AD converter 2 according to the second embodiment. A description will first be given of a preceding stage in the AD converter 2. An input analog signal Vin is fed to a fourth amplifier circuit 32 and a third AD converter circuit 34. The third AD converter circuit 34 is of a flash type and the resolution thereof, i.e. the number of bits produced by conversion thereby, is 4 bits. The third AD converter circuit 34 converts a sampled input analog signal into a digital value, retrieves the higher 4 bits (D12-D9) and outputs the bits to an encoder (not shown) and to a second DA converter circuit 36. The second DA converter circuit 36 converts the digital value produced by conversion by the third AD converter circuit 34 into an analog value. The fourth amplifier circuit 32 samples the input analog signal, holds the sampled signal for a predetermined period of time and outputs the held signal to a second subtractor circuit 38. The fourth amplifier circuit 32 provides an amplification gain of 1.0 so as to function as a sample and hold circuit. The second subtractor circuit 38 subtracts the output of the second DA converter circuit 36 from the output of the fourth amplifier circuit 32. A fifth amplifier circuit 40 amplifies the output of the second subtractor circuit 38 by a factor of 8. A second subtracting amplifier circuit 42 of an integral type may be used instead of the second subtractor circuit 38 and the fifth amplifier circuit 40. In this way, the circuit is simplified.

A fifth AD converter circuit 56 samples the output of the second subtractor circuit 38 according to the same timing schedule as the fifth amplifier circuit 40. The fifth AD converter circuit 56 converts the input analog signal into a digital value and outputs the digital value to a fourth DA converter circuit 58. The fourth DA converter circuit 58 converts the digital value produced by conversion by the fifth AD converter circuit 56 into an analog value. The output of the fourth DA converter circuit 58 is amplified practically by a factor of 8. As described later, the fifth AD converter circuit 56 and the fourth DA converter circuit 58 each functions as a predictor unit for predicting the analog signal sampled by the fifth amplifier circuit 40.

A description will now be given of the subsequent stage. A fifth switch SW22 and a sixth switch SW24 are alternately turned on and off. When the fifth switch SW22 is turned on and the sixth switch SW24 is turned off, the analog signal input from the preceding stage via the fifth switch SW22 is fed to a sixth amplifier circuit 44 and a fourth AD converter circuit 46. The fourth AD converter circuit 46 is also of a flash type and the resolution thereof, i.e. the number of bits not including the redundant 1 bit, is 3 bits. The fourth AD converter circuit 46 converts the input analog signal into a digital value, retrieves the 5th through 7th highest bits (D8-D6) not including a redundant bit and outputs the bits to the encoder (not shown) and a third DA converter circuit 48. The third DA converter circuit 40 converts the digital value produced by conversion by the fourth AD converter circuit 46 into an analog value.

The sixth amplifier circuit 44 samples the input analog signal, holds the sampled signal for a predetermined period of time and outputs the held signal to a third subtractor circuit 50. The sixth amplifier circuit 44 provides an amplification factor of 1.0 so as to function as a sample and hold circuit. The third subtractor circuit 50 subtracts the output of the third DA converter circuit 48 from the output of the sixth amplifier circuit 44 and outputs a difference to a seventh amplifier circuit 52.

The seventh amplifier circuit 52 amplifies the output of the third subtractor circuit 50 by a factor of 8. At this point of time, the fifth switch SW22 is turned off and the sixth switch SW24 has made a transition to an on state. The analog signal amplified by the seventh amplifier circuit 52 is fed back to the sixth amplifier circuit 44 and the fourth AD converter circuit 46 via the sixth switch SW24. A third subtracting amplifier circuit 54 of an integral type may be used instead of the third subtractor circuit 50 and the seventh amplifier circuit 52. The process described above is repeated so that the fourth AD converter circuit 46 retrieves the 8th through 10th highest bits (D5-D3) not including a redundant bit, and the 11th through 13th highest bits (D2-D0) not including a redundant bit. With this, a 13-bit digital value is obtained. The 5th through 13th highest bits are obtained by the subsequent stage of a cyclic type.

Figure 7:
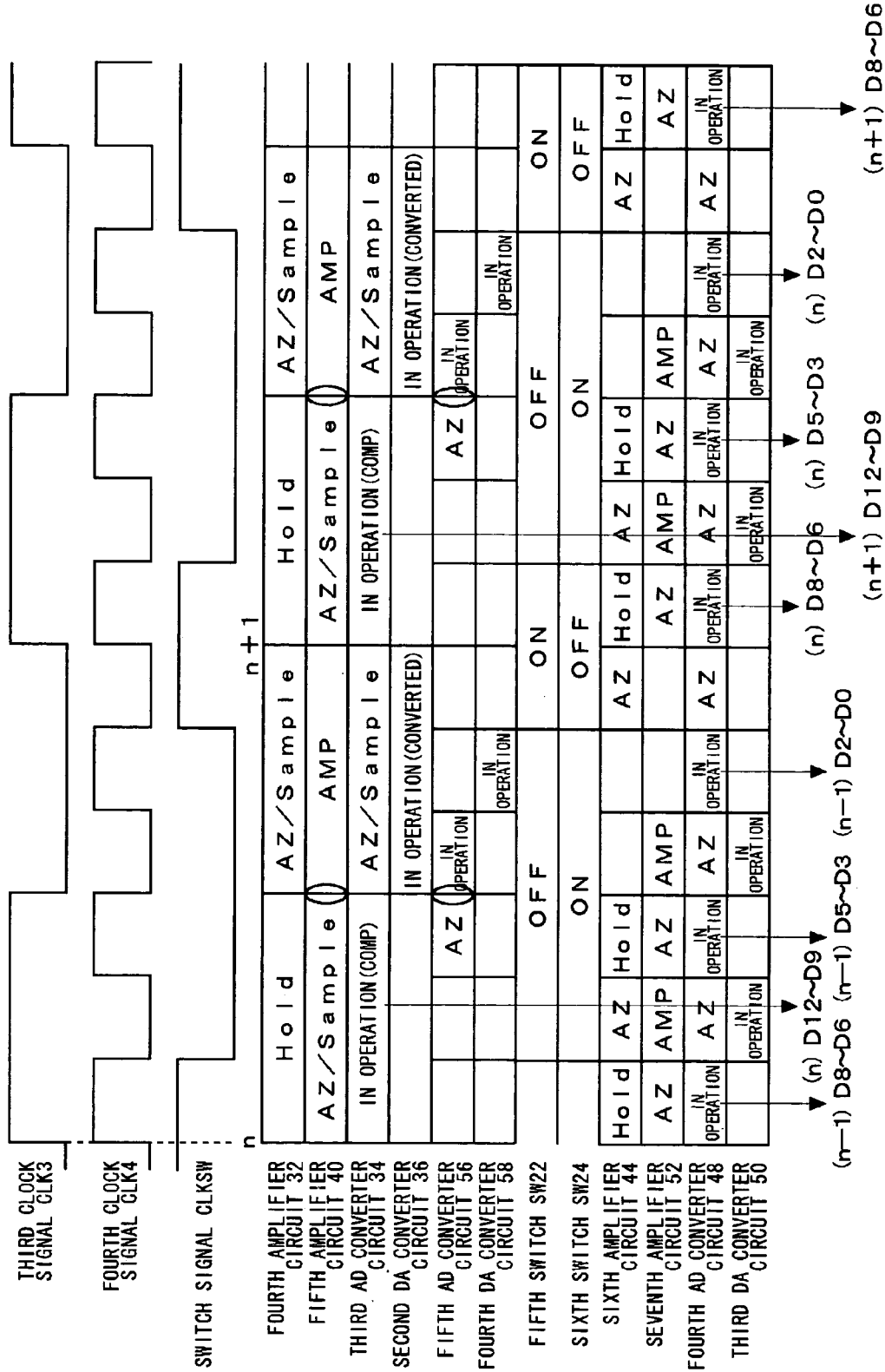
FIG. 7 is a timing chart showing the operating process of the AD converter according to the second embodiment.

FIG. 7 is a time chart showing the operating process of the AD converter 2 according to the second embodiment. The process will be described from the first step downward in the figure. Three waveforms at the top are for a third clock signal CLK3, a fourth clock signal CLK4 and a switch signal CLKSW in the illustrated order. The third clock signal CLK3 controls the operation of the fourth amplifier circuit 32, the fifth amplifier circuit 40, the third AD converter circuit 34 and the second DA converter circuit 36. The fourth clock signal CLK4 controls the operation of the sixth amplifier circuit 44, the seventh amplifier circuit 52, the fourth AD converter circuit 46, the third DA converter circuit 48, the fifth AD converter circuit 56 and the fourth DA converter circuit 58. The switch signal CLKSW applies on and off control of the fifth switch SW22 and the sixth switch SW24.

The frequency of the fourth clock signal CLK4 is three times that of the third clock signal CLK3. The fourth clock signal CLK4 may be generated by multiplying the third clock signal CLK3 using a PLL or the like. A rising edge of the fourth clock signal CLK4 is synchronized with a rising edge of the third clock signal CLK3. Subsequently, a second falling edge of the fourth clock signal CLK4 is synchronized with a falling edge of the third clock signal CLK3. Further, a fourth rising edge of the fourth clock signal CLK4 is synchronized with a second rising edge of the third clock signal CLK3. Since the frequency of the fourth clock CLK4 is three times that of the third clock signal CLK3, the conversion speed in the subsequent stage is three times that of the conversion speed in the preceding stage. Analog processes such as subtraction and amplification for conversion into relatively higher order bits largely affect overall precision in conversion. Therefore, higher precision is required of the preceding stage responsible for conversion into relatively higher order bits. In this respect, it is possible to increase the speed of operation in the subsequent stage as compared to the preceding stage, since the subsequent stage is not required to provide precision as high as that required in the preceding stage.

The fourth amplifier circuit 32 and the third AD converter circuit 34 sample the input analog signal Vin at a rising edge of the third clock signal CLK3. The fourth amplifier circuit 32 holds the sampled analog signal when the third clock signal CLK3 is high and is placed in an auto-zero operation mode when the third clock signal CLK3 is low. The fifth amplifier circuit 40 samples the input analog signal at a falling edge of the third clock signal CLK3. When the third clock signal CLK3 is low, the fifth amplifier circuit 40 amplifies the sampled analog signal and outputs the amplified signal to the sixth amplifier circuit 44 and the fifth AD converter circuit 56. When the third clock signal CLK3 is high, the fifth amplifier circuit 40 is placed in an auto-zero operation mode. When the second subtracting amplifier circuit 42 is used in place of the fifth amplifier circuit 40, the second subtracting amplifier circuit 42 subjects the sampled analog signal to subtraction and amplification when the third clock signal CLK3 is low. The third AD converter circuit 34 converts into a digital value comprising the D12-D9 bits for output when the third clock signal CLK3 is high and is placed in an auto-zero operation mode when the third clock signal CLK3 is low. The second DA converter circuit 36 holds the converted data when the third clock signal CLK3 is low and is in an undefined state when the third clock signal CLK3 is high.

The fifth AD converter circuit 56 samples the input analog signal in synchronization with the sampling by the fifth AD converter circuit 40. The period in which the fifth AD converter circuit 56 operates for conversion may be configured to be shorter than the period of amplification by the fifth amplifier circuit 40. For example, the fifth AD converter circuit 56 converts into a digital value for output to the fourth DA converter circuit 58 when the fourth clock signal CLK4 is low and is placed in an auto-zero operation mode when the fourth clock signal CLK4 is high. The fourth DA converter circuit 58 holds the converted data when the fourth clock signal CLK4 is high and is in an undefined state when the fourth clock signal CLK4 is low. The fourth DA converter circuit 58 may hold the converted data in a period subsequent to the period for conversion by the fifth AD converter circuit 56.

The fifth switch SW22 is turned on when the switch signal CLKSW is high and turned off when the switch signal CLKSW is low. The sixth switch SW24 is turned on when the switch signal CLKSW is low and turned off when the switch signal CLKSW is high.

The sixth amplifier circuit 44 and the fourth AD converter circuit 46 sample the input analog signal at a rising edge of the fourth clock signal CLK4. The sixth amplifier circuit 44 holds the sampled analog signal when the fourth clock signal CLK4 is high and is placed in an auto-zero operation mode when the fourth clock signal CLK4 is low. The sixth amplifier circuit 44 does not hold when the fourth AD converter circuit 46 converts into the lowest bits D2-D0. The seventh amplifier circuit 52 samples the input analog signal at a falling edge of the fourth clock signal CLK4. The seventh amplifier circuit 52 amplifies the sampled analog signal when the fourth clock signal CLK4 is low and is placed in an auto-zero operation mode when the fourth clock signal CLK4 is high. When the third subtracting amplifier circuit 54 is used in place of the seventh amplifier circuit 52, the third subtracting amplifier circuit 54 subjects the sampled analog signal to subtraction and amplification when the fourth clock signal CLK4 is low. Amplification is not performed during the subsequent half-clock period after the fourth AD converter circuit 46 converted into the bits D2-D0.

When the second clock signal CLK2 is high, the second AD converter circuit 17 converts into 3 bits, including a redundant bit, for output. The second AD converter 17 is placed in an auto-zero operation mode when the second clock signal CLK2 is low. The second DA converter circuit 18 holds the converted data when the second clock signal CLK2 is low and is in an undefined state when the second clock signal CLK2 is high. Conversion is not performed when the second AD converter circuit 17 outputs the bits D2-D0.

In an auto-zero period, the fourth amplifier circuit 32, the fifth amplifier circuit 40, the sixth amplifier circuit 44, the seventh amplifier circuit 52, the third AD converter circuit 34 and the fourth AD converter circuit 46 are operating to sample the input signal. As shown, while the fourth AD converter circuit 46 is converting into D8-D and D5-D3, the third AD converter circuit 34 is converting from a subsequently input analog signal Vin concurrently. According to the pipeline process as described above, the AD converter 2 as a whole is capable of outputting a digital value of 13 bits once in a cycle defined by the third clock signal CLK3.

The sixth amplifier circuit 44 of the AD converter 2 according to this embodiment may be embodied by a switched capacitor amplifier circuit as described with reference to FIGS. 4 and 5. The fifth AD converter circuit 56 converts the analog signal sampled by the fifth amplifier circuit 40 into a digital value of a predetermined number of bits and the fourth DA converter circuit 58 converts the digital value into an analog signal. The analog signal is amplified by a factor of 8 to adapt to the amplification factor of the sixth amplifier circuit 44. The fourth DA converter circuit 58 outputs the analog signal to the sixth amplifier circuit 44 in a period when the previous period for amplification by the sixth amplifier circuit 44 is completed and the fifth switch SW22 is yet to be turned on.

This ensures that the voltage stored in the input capacitors of the sixth amplifier circuit 44 is substantially equal to the voltage output from the fifth amplifier circuit 40, when the fifth switch SW22 is turned on so that the fifth amplifier circuit 40 and the sixth amplifier circuit 44 are connected to each other. Therefore, adverse effects of noise on the output voltage of the fifth amplifier circuit 40 are mitigated so that settling time is reduced. By increasing the number of bits produced by conversion by the fifth AD converter circuit 56, the output voltage of the fifth amplifier circuit 40 can be predicted with higher precision so that adverse effects of noise are further mitigated.

In the description of the second embodiment given above, the fifth AD converter circuit 56 samples the output of the second subtractor circuit 38. Alternatively, the fifth AD converter circuit 56 may sample the output of the fifth amplifier circuit 49. In this case, timing requirement is more severe than when the output of the second subtractor circuit 38 is sampled but the need to amplifier the output of the fourth DA converter circuit 58 by a factor of 8 is eliminated.

Third Embodiment

Figure 8:
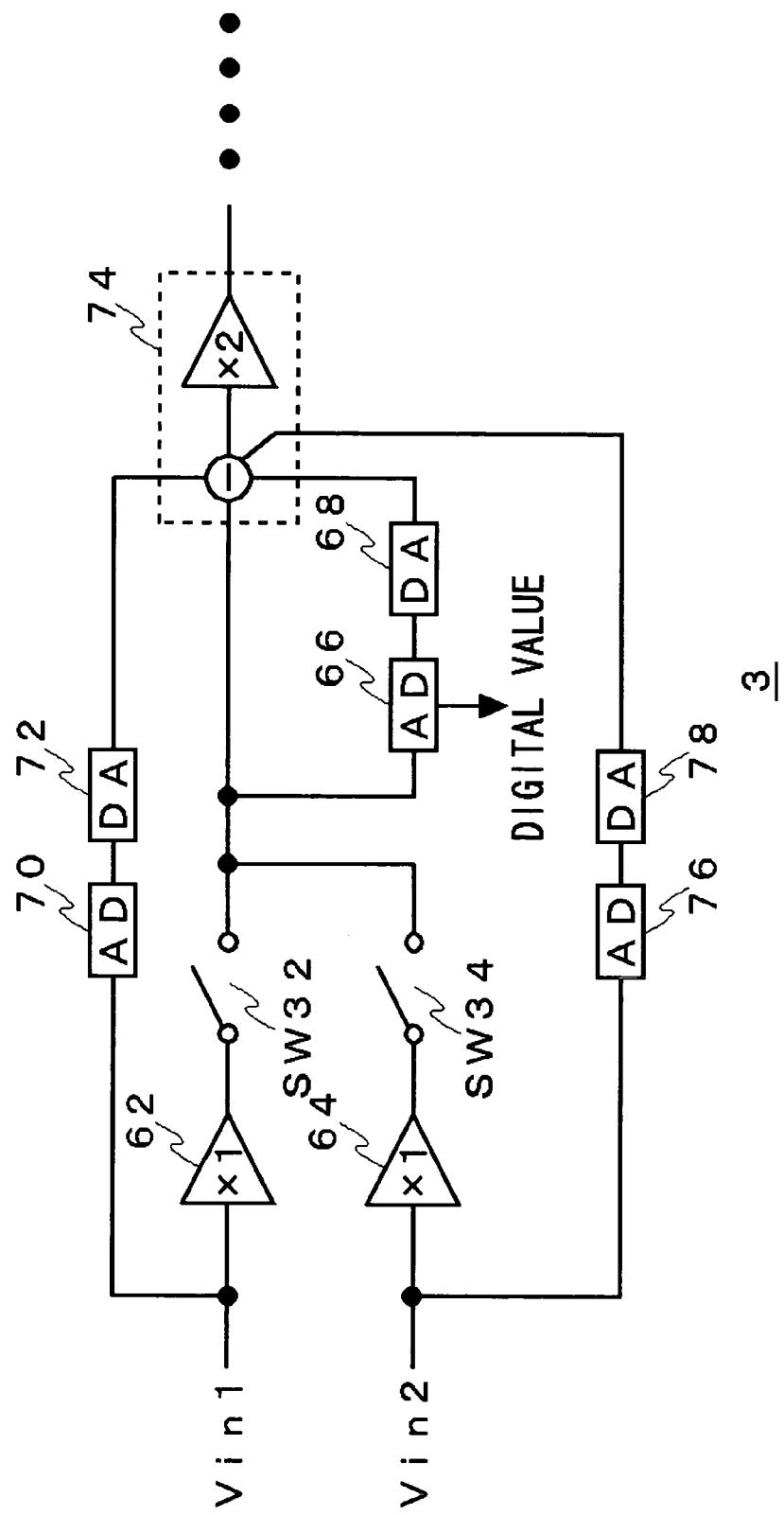
FIG. 8 shows the structure of an AD converter according to a third embodiment of the present invention.

The third embodiment pertains to an AD converter 3 of a pipeline type. FIG. 8 shows a part of the AD converter 3. The AD converter 3 of the third embodiment 3 receives two inputs. The structure involving a fourth subtracting amplifier circuit 74 and the components subsequent thereto may be arbitrarily designed. For example, the cyclic stage as described in the first and second embodiments may be provided.

FIG. 8 shows the structure of the AD converter 3 according to the third embodiment. In the AD converter 3, a first input analog signal Vin1 is sampled by an eighth amplifier circuit 62. The eighth amplifier circuit 62 holds the first input analog signal Vin1 thus sampled for a predetermined period of time and outputs the held signal to a sixth AD converter circuit 66 and a fourth subtracting amplifier circuit 74 via a seventh switch SW32. The eighth amplifier circuit 62 provides an amplification gain of 1.0 so as to function as a sample and hold circuit.

Similarly, a second input analog signal Vin2 is sampled by a ninth amplifier circuit 64. The ninth amplifier circuit 64 holds the second input analog signal Vin2 thus sampled for a predetermined period of time and outputs the held signal to the sixth AD converter circuit 66 and the fourth subtracting amplifier circuit 74 via an eighth switch SW34. Similarly to the eighth amplifier circuit 62, the ninth amplifier circuit 64 also functions as a sample and hold circuit.

The sixth AD converter circuit 66 converts the input analog signal into a digital value with a predetermined resolution. The sixth AD converter circuit 66 is of a flash type comprising a plurality of comparators. Reference voltages with a step size defined by the least significant bit (LSB) are supplied to respective comparators. Each of the comparators compares the supplied reference voltage with the input analog signal so as to output a high signal or a low signal.

A fifth DA converter circuit 68 converts the outputs of the comparators of the sixth AD converter circuit 66 into an analog value. The fourth subtracting amplifier circuit 74 subtracts an output analog signal from the fifth DA converter circuit 68 from the sampled analog signal and amplifies a result of subtraction by a predetermined factor (in the example shown in FIG. 8, by a factor of 2). The fourth subtracting amplifier circuit 74 may be embodied by a switched capacitor amplifier circuit as described with reference to FIGS. 4 and 5.

A seventh AD converter circuit 70 samples the first input analog signal Vin1 according to the same timing schedule as the eighth amplifier circuit 62. The seventh AD converter circuit 70 converts the first input analog signal Vin1 thus sampled into a digital value of a predetermined number of bits and outputs the digital value to a sixth DA converter circuit 72. The sixth DA converter circuit 72 converts the digital value produced by conversion by the seventh AD converter circuit 70 into an analog value and outputs the analog value to the fourth subtracting amplifier circuit 74. It is preferable that the output to the fourth subtracting amplifier circuit 74 occurs in a period in which the period of amplification in the fourth subtracting amplifier circuit 74 is over and the seventh switch SW32 is yet to be turned on. Desirably, the output occurs immediately before the seventh switch SW32 is turned on. Thus, the seventh AD converter circuit 70 and the sixth DA converter circuit 72 each functions as a predicting unit for predicting an analog signal sampled by the eighth amplifier circuit 62.

To describe the operation timing observed in the AD converter 3 according to this embodiment briefly, the sixth AD converter circuit 66 performs comparison while the fourth subtracting amplifier circuit 74 is placed in an auto-zero operation mode and is placed in an auto-zero operation mode while the fourth subtracting amplifier circuit 74 is operating for subtracting amplification. The fifth DA converter circuit 68 holds the converted data while the fourth subtracting amplifier circuit 74 is operating for subtracting amplification and is in an undefined state while the fourth subtracting amplifier circuit 74 is placed in an auto-zero operation mode.

Thus, if a sample and hold circuit is not provided parallel to the sixth AD converter circuit 66, threshold voltages may first be input to the comparators of the sixth AD converter circuit 66 before the analog signal is input thereto for comparison. According to this approach, the fourth subtracting amplifier circuit 74 need not observe so severe timing requirement as when the analog signal is simultaneously sampled by the fourth subtracting amplifier circuit 74 and the sixth AD converter circuit 66. Therefore, a longer period of time for auto-zero period is secured. In addition, a longer period of time for comparison in the sixth AD converter circuit 66 is secured. An eighth AD converter circuit 76 samples the second input analog signal Vin2 according to the same timing schedule as the ninth amplifier circuit 64. The eighth AD converter circuit 76 converts the second input analog signal Vin2 thus sampled into a digital of a predetermined number of bits and outputs the digital number to a seventh DA converter circuit 78. The operation of the eighth AD converter circuit 76 and the seventh DA converter circuit 78 is the same as the operation of the seventh AD converter circuit 70 and the sixth DA converter circuit 72.

As described above, the present invention is equally applicable to structures other than the structure described in the first and second embodiments. For example, the present invention is applicable to an AD converter including a structure described in the third embodiment in which the eighth amplifier circuit 62 and the fourth subtracting amplifier circuit 74 are connected to each other via the seventh switch SW32. According to the third embodiment, distortion that may occur in the output voltage of the eighth amplifier circuit when the eighth amplifier circuit 62 and the fourth subtracting amplifier circuit 74 are connected to each other is mitigated so that the output voltage of the eight amplifier circuit 62 is allowed to settle earlier than otherwise. A similar advantage is obtained in the ninth amplifier circuit 64.

In applications where the sampling timing in the eighth amplifier circuit 62 and in the ninth amplifier circuit 64 differ significantly, the eight amplifier circuit 62 and the ninth amplifier circuit 64 may share the seventh AD converter circuit 70 and the sixth DA converter circuit 72. The aforementioned structure will also reduce the settling time of the eighth amplifier circuit 62 and the ninth amplifier circuit 64.

Fourth Embodiment

Figure 9:
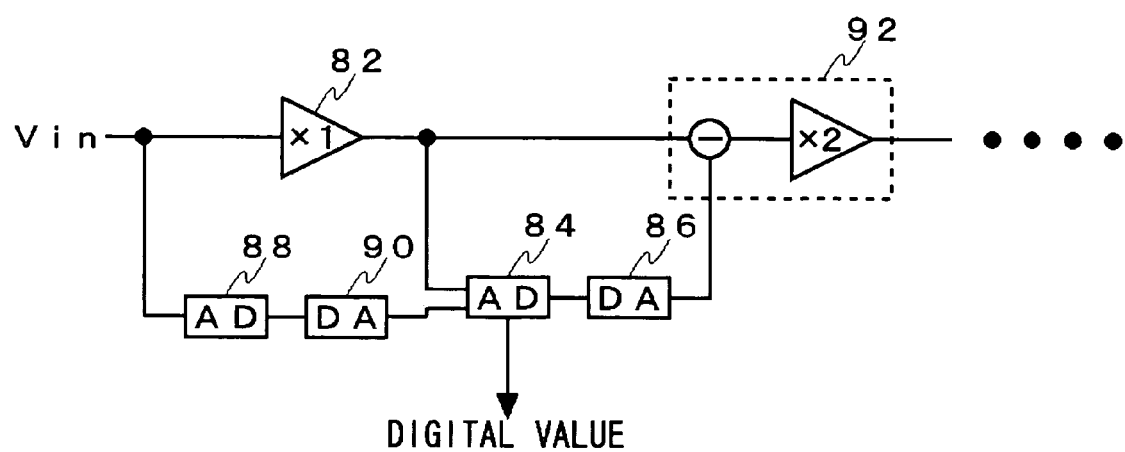
FIG. 9 shows the structure of an AD converter according to a fourth embodiment of the present invention.

The fourth embodiment pertains to an AD converter 4 of a pipeline type. FIG. 9 shows a part of the AD converter 4. When a capacitor for chopping an input analog signal is connected to the input terminal of a ninth AD converter circuit 84, the output voltage of a tenth amplifier circuit 82 is adversely affected by charges stored in the capacitor, when the analog signal is fed from the tenth amplifier circuit 82 to the ninth AD converter circuit 84. The fourth embodiment offers reduction of effects from noise due to charges stored in the capacitor.

FIG. 9 shows the structure of the AD converter 4 according to the fourth embodiment. In the AD converter 4, an input analog signal Vin is sampled by a tenth amplifier circuit 82. The tenth amplifier circuit 82 holds the input analog signal Vin thus sampled for a predetermined period of time and outputs the held signal to a ninth AD converter circuit 84 and a fifth subtracting amplifier circuit 92. The tenth amplifier circuit 82 does not amplify the sampled analog signal and functions as a sample and hold circuit.

Figure 10:
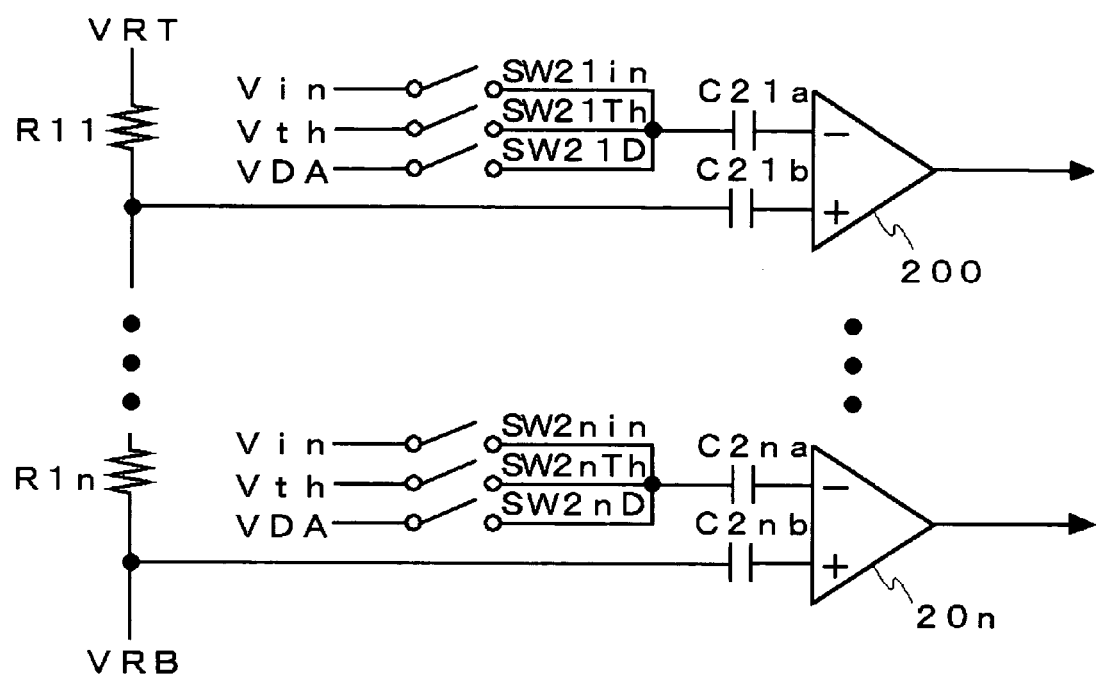
FIG. 10 shows an exemplary structure of a ninth AD converter circuit.

The ninth AD converter circuit 84 converts the input analog signal into a digital value with a predetermined resolution. FIG. 10 shows an exemplary structure of the ninth AD converter circuit 84. The ninth AD converter circuit 84 is of a flash type comprising a plurality of comparators. In FIG. 10, only two comparators 200 and 20n are shown for brevity. Input capacitors C21a and C21b are connected to the inverting input terminal and the non-inverting input terminal of the comparator 200, respectively. A Vin switch SW21in, a threshold voltage switch SW21Th and a digital-to-analog converter (DAC) output switch SW21D are connected in parallel to the other end of the input comparator C21a. The Vin switch SW21in applies on and off control of a route between the tenth amplifier circuit 82 and the input capacitor C21a. The threshold voltage switch SW21Th applies on and off control of a route between a voltage source generating a voltage equal to the threshold voltage of a transistor constituting the comparator 200 and the input capacitor C21a. The DAC output switch SW21D applies on and off control of a route between a ninth DA converter circuit 90 described later and the input capacitor C21a.

The other end of the input capacitor C21b connected to the other end of the comparator 200 is connected to a reference potential generated by a resistor string circuit between a higher reference voltage VRT and a lower reference voltage VRB with a step size defined by the least significant bit (LSB). Each of the comparators 200–20n compares the reference voltage with the input analog signal so as to output a high signal or a low signal.

An eighth DA converter circuit 86 converts the outputs of the comparators 200–20n of the ninth AD converter circuit 84 into an analog signal. The fifth subtracting amplifier circuit 92 subtracts an output analog signal from the eighth DA converter circuit 86 from the sampled analog signal and amplifies a result of subtraction by a predetermined factor (in the example shown in FIG. 9, by a factor of 2).

A tenth AD converter circuit 88 samples the first input analog signal Vin according to the same timing schedule as the tenth amplifier circuit 82. The tenth AD converter circuit 88 converts the input analog signal Vin thus sampled into a digital value of a predetermined number of bits and outputs the digital value to the ninth DA converter circuit 90. The ninth DA converter circuit 90 converts the digital value produced by conversion by the tenth AD converter circuit 88 into an analog value and outputs the analog value to the ninth AD converter circuit 84. As described later, the tenth AD converter circuit 88 and the ninth DA converter circuit 90 function as a predictor unit for predicting the input analog signal sampled by the tenth amplifier circuit 82.

To describe the operation timing observed in the AD converter 4 according to this embodiment briefly, the ninth AD converter circuit 84 performs comparison while the fifth subtracting amplifier circuit 92 is placed in an auto-zero operation mode. The ninth AD converter circuit 84 is placed in an auto-zero operation mode while the fifth subtracting amplifier circuit 92 is operating for subtracting amplification. Upon making a transition to an auto-zero operation mode, the ninth AD converter circuit 84 turns the threshold switches SW21Th–SW2nTh on, turns the Vin switches SW21in–SW2nin and the DAC output switches SW21D–SW2nD off so as to apply the threshold voltage to the input capacitors C21a–C2na. The comparators 200–20n sample the threshold voltage chopped by the input capacitors C21a–C2na.

Before making a transition to a period for comparison, the ninth AD converter circuit 84 turns the DAC output switches SW21D-SW2nD on and turns the threshold switches SW21Th–SW2nTh off so as to apply the output voltage of the tenth AD converter circuit 88 to the input capacitors C21a–C2n and adjust charges in the input capacitors C21a–C2na.

Upon making a transition to a period for comparison, the ninth AD converter circuit 84 turns the Vin switches SW21in–SW2nin on and turns the DAC output switches SW21D–SW2nD off so as to apply the output voltage of the tenth amplifier circuit 82 to the input capacitors C21a–C2na. The comparators 200–20n sample the voltage chopped by the input capacitors C21a–C2na, compares the sampled voltage with the reference voltage input to the other end and outputs a result of comparison.

The eighth DA converter circuit 86 holds the converted data while the fifth subtracting amplifier circuit 92 is operating for subtracting amplification and is in an undefined state while the fifth subtracting amplifier circuit 92 is placed in an auto-zero operation mode.

Similarly to the third embodiment, if a sample and hold circuit is not provided parallel to the ninth AD converter circuit 84, the ninth AD converter circuit 84 and the fifth subtracting amplifier circuit 92 do not sample the output of the tenth amplifier circuit 82 according to the same timing schedule. Accordingly, there is a likelihood that the output voltage of the tenth amplifier circuit 82 is distorted significantly by being affected by charges of unknown magnitude stored in the input capacitors C21a–C2na, when the Vin switches SW21in–SW2nin are turned on so as to connect the tenth amplifier circuit 82 and the ninth AD converter circuit 84 to each other.

By applying the output voltage of the tenth amplifier circuit 88 to the input capacitors C21a–Cna of the ninth AD converter circuit 84 before turning the Vin switches SW21in–SW2nin on, it is ensured that the output voltage of the tenth amplifier circuit 82 is substantially equal to the voltage stored in the input capacitors C21a–Cna, when the tenth amplifier circuit 82 and the ninth AD converter circuit 84 are connected to each other. Thus, effects of nose on the output of the tenth amplifier circuit 82 are mitigated so that settling time is reduced.

Described above is an explanation of the present invention based on the embodiments. The description of the embodiment sis illustrative in nature and various variations in constituting elements and processes involved are possible. Those skilled in the art would readily appreciate that the variations are also within the scope of the present invention.

A description was given of a single-ended switched capacitor amplifier circuit with reference to FIGS. 4 and 5. Application to a fully differential switched capacitor amplifier circuit is within the scope of the invention. In this case, input capacitors C1–Cn are connected to both ends of the operational amplifier 100. The fully differential switched capacitor amplifier circuit is more resistant to nose than a single-ended type.

A sample and hold circuit may be used in place of the seventh AD converter circuit 0 and the sixth DA converter circuit 72 of the third embodiment. A similar thing is true of the eighth AD converter circuit 76 and the seventh DA converter circuit 78. A sample and hold circuit may be used in place of the tenth AD converter circuit 88 and the ninth DA converter circuit 90 of the fourth embodiment. These approaches can also mitigate distortion in the output voltage of the eighth amplifier circuit 62, the ninth amplifier circuit 64, the ninth amplifier circuit 64 or the tenth amplifier circuit 82.

In an alternative approach to mitigate distortion, a constant voltage may be used to adjust charges stored in the capacitors. For example, given that the output voltage of an amplifier circuit is positive and negative charges are stored in the input capacitors coupled to a circuit element in a subsequent stage, distortion is mitigated by feeding a voltage in the neighborhood of 0V as a voltage to adjust charges.

Parameters such as the number of bits produced as a result of conversion, allocation of conversion bits, the gain of the amplifier circuits, the LSB voltage and the reference voltage given in the description above of the embodiments are merely by way of examples. Other parameter values may also be employed in the variations. The present invention is also applicable to a pipeline comprising three or more stages. One or more of those stages may be of a cyclic type.

Although the present invention has been described by way of exemplary embodiments, it should be understood that many changes and substitutions may be made by those skilled in the art without departing from the spirit and the scope of the present invention which is defined only by the appended claims.

What is claimed is:

1. An analog-to-digital converter which converts an analog signal into a digital value in a plurality of steps, comprising:
    an amplifier circuit which amplifies an input analog signal by a predetermined amplification factor;
    a circuit element with a capacitively coupled input which receives an output signal from the amplifier circuit at one end of a capacitor connected to an input terminal of the circuit element and which samples an output signal occurring at the other end of the capacitor,
    a predictor unit which predicts a voltage of the output signal from the amplifier circuit sampled by the circuit element, wherein
    the predictor unit applies a voltage that approximates the voltage of the output signal of the amplifier circuit sampled by the circuit element to the capacitor, before the output signal of the amplifier circuit is input to the capacitor.

2. An analog-to-digital converter according to claim 1, wherein the circuit element is an amplifier circuit which amplifies the sampled analog signal.

3. The analog-to-digital converter according to claim 2, further comprising a predictor unit which predicts a voltage of the output signal sampled by the circuit element, wherein the predictor unit applies the predicted voltage to the capacitor as the adjustment voltage.

4. The analog-to-digital converter according to claim 3, wherein the predictor unit applies a voltage that approximates the voltage of the output signal sampled by the circuit element to the capacitor.

5. The analog-to-digital converter according to claim 3, wherein the predictor unit applies a constant voltage to the capacitor.

6. The analog-to-digital converter circuit according to claim 1, further comprising a switch which applies on and off control of a route between the amplifier circuit and the circuit element, wherein the adjustment voltage is applied to the capacitor before the switch is turned on.

7. The analog-to-digital converter according to claim 1, wherein the predictor unit applies a constant voltage to the capacitor.

8. An analog-to-digital converter which converts an analog signal into a digital value in a plurality of steps, comprising:
    an amplifier circuit which amplifies an input analog signal by a predetermined amplification factor;
    a circuit element with a capacitively coupled input which receives an output signal from the amplifier circuit at one end of a capacitor connected to an input terminal of the circuit element and which samples an output signal occurring at the other end of the capacitor, wherein an adjustment voltage for adjusting charges stored in the capacitor is applied to the capacitor before the output signal is input to the capacitor, and wherein the circuit element is a sub-analog-to-digital converter circuit which converts the sampled analog signal into a digital signal of a predetermined number of bits.

9. An analog-to-digital converter which converts an input analog signal into a digital value in a plurality of steps, comprising:

an analog-digital converter circuit which samples an input analog signal and converts the sampled analog signal into a digital value of a predetermined number of bits;

a digital-to-analog converter circuit which converts an output signal of the analog-to-digital converter circuit into an analog signal;

a first amplifier circuit which is provided parallel to the analog-to-digital circuit and amplifies the analog signal sampled by the analog-to-digital converter circuit by a predetermined amplification factor;

a subtracting amplifier circuit with a capacitively coupled input which receives a signal at one end of a capacitor connected to an input terminal of the subtracting amplifier circuit and which samples a signal occurring at the other end of the capacitor, the subtracting amplifier circuit subtracting an output signal from the digital-to-analog converter circuit from an output signal from the first amplifier circuit, wherein the output signal from the digital-to-analog converter circuit is applied to the capacitor before the output signal from the first amplifier circuit is input to the capacitor.

10. The analog-to-digital converter according to claim 9, further comprising a switch which applies on and off control of a route between the first amplifier circuit and the subtracting amplifier circuit, wherein the output signal from the digital-to-analog converter circuit is applied to the capacitor before the switch is turned on.

11. The analog-to-digital converter according to claim 10, wherein the subtracting amplifier circuit is a switched capacitor operational amplifier.

12. The analog-to-digital converter according to claim 9, wherein the subtracting amplifier circuit is a switched capacitor operational amplifier.

* * * * *